(12) United States Patent
Yang

(10) Patent No.: US 7,897,883 B2
(45) Date of Patent: Mar. 1, 2011

(54) LIGHT EMITTING ASSEMBLY AND METHOD FOR ASSEMBLING THE SAME

(75) Inventor: Yueh-Hsun Yang, Tainan (TW)

(73) Assignee: T.Y.C. Brother Industrial Co., Ltd., Tainan (TW)

( * ) Notice: Subject to any disclaimer, the term of this patent is extended or adjusted under 35 U.S.C. 154(b) by 370 days.

(21) Appl. No.: 12/138,592

(22) Filed: Jun. 13, 2008

(65) Prior Publication Data

US 2009/0141468 A1  Jun. 4, 2009

(51) Int. Cl.
*H05K 7/14* (2006.01)

(52) U.S. Cl. ......... 174/535; 361/760; 361/807; 174/262; 174/541

(58) Field of Classification Search ............... 174/50.52, 174/50.56, 50.57, 50.6, 535, 536, 541, 262; 361/760, 806–810; 362/652, 545, 646, 657–659, 362/252, 249.01, 249.02, 391, 800; 439/890, 439/669.2, 36, 56, 395, 404, 443, 414, 417–419, 336, 541, 619, 918, 391

See application file for complete search history.

(56) References Cited

U.S. PATENT DOCUMENTS

| 4,171,855 | A * | 10/1979 | Raskin | 439/70 |
| 7,341,371 | B2 * | 3/2008 | Kuo et al. | 362/659 |
| 2001/0007526 | A1 * | 7/2001 | Ohkohdo et al. | 362/249 |
| 2002/0175333 | A1 * | 11/2002 | Wang | 257/79 |
| 2005/0263381 | A1 * | 12/2005 | Bouvier et al. | 200/314 |

* cited by examiner

*Primary Examiner* — Dameon E Levi
*Assistant Examiner* — Hoa C Nguyen
(74) *Attorney, Agent, or Firm* — Banner & Witcoff, Ltd.

(57) ABSTRACT

A lead-mounting seat includes a conductive seat body including a lead-mounting plate and spaced apart first and second insert legs that extend from the lead-mounting plate and that have different geometric shapes. The lead-mounting plate is formed with a plurality of lead-mounting holes. Each of the first and second insert legs has a connecting end connected to the lead-mounting plate, and a free end opposite to the connecting end. Each of the first and second insert legs is reduced in width from the connecting end to the free end.

11 Claims, 8 Drawing Sheets

LIGHT EMITTING ASSEMBLY AND METHOD FOR ASSEMBLING THE SAME

BACKGROUND OF THE INVENTION

1. Field of the Invention

The invention relates to a light emitting assembly and a method for assembling the same, more particularly to a light emitting assembly including a lead-mounting seat for mounting a light emitting member to a circuit board.

2. Description of the Related Art

Referring to FIGS. 1 and 2, a conventional light emitting assembly is shown to include a circuit board 11, a plurality of light emitting diodes (LEDs) 12, and a plurality of lead-mounting seats 13. The circuit board 11 is formed with a plurality of hole sets 110, each of which has a pair of insert holes 111. Each of the lead-mounting seats 13 includes a mounting plate 132 formed with a pair of lead insert tubes 133, and a pair of insert legs 134 extending from the mounting plate 132. Each of the light emitting diodes 12 includes a light emitting portion 121 and two pairs of spaced apart leads 122.

In assembly, the leads 122 of each of the light emitting diodes 12 are inserted into and secured by soldering to the insert tubes 133 of a corresponding pair of the lead-mounting plates 13, and the insert legs 134 of the lead-mounting plates 13 are inserted into and secured by soldering to the corresponding insert holes 111 in the circuit board 11 so as to mount and connect electrically the light emitting diode 12 to the circuit board 11.

The conventional lead-mounting seat 13 is disadvantageous in that a light emitting angle of the light emitting diode 12 relative to the circuit board 11 can not be adjusted. When the light emitting angle of the light emitting diode 12 relative to the circuit board 11 is desired to be different (such as the imaginary line illustrated in FIG. 2), the lead-mounting seat 13' is required to be designed to have an appropriate angle between the mounting plate 132 and the pair of the insert legs 134 corresponding to the desired light emitting angle of the light emitting diode 12, which is not flexible and makes manufacture of the lead-mounting seat 13, 13' inefficient. Hence, there is a need to design a lead-mounting seat that can provide adjustment of the light emitting angle for the light emitting diode 12 before the lead-mounting seat is secured to the circuit board 11.

SUMMARY OF THE INVENTION

Therefore, an object of the present invention is to provide a lead-mounting seat that can overcome the aforesaid drawback associated with the prior art.

According to one aspect of the present invention, a lead-mounting seat comprises a conductive seat body including a lead-mounting plate and spaced apart first and second insert legs that extend from the lead-mounting plate and that have different geometric shapes. The lead-mounting plate is formed with a plurality of lead-mounting holes. Each of the first and second insert legs has a connecting end connected to the lead-mounting plate, and a free end opposite to the connecting end. Each of the first and second insert legs is reduced in width from the connecting end to the free end.

According to another aspect of the present invention, a light emitting assembly comprises: a circuit board formed with first and second insert holes that are spaced apart from each other; a lead-mounting seat having a conductive seat body including a lead-mounting plate and spaced apart first and second insert legs inserted into the first and second insert holes in the circuit board, extending from the lead-mounting plate, and having different geometric shapes, the lead-mounting plate being formed with a plurality of lead-mounting holes, each of the first and second insert legs having a connecting end connected to the lead-mounting plate, and a free end opposite to the connecting end, each of the first and second insert legs being reduced in width from the connecting end to the free end; and a light emitting member having leads extending through the lead-mounting holes in the lead-mounting plate.

According to yet another aspect of the present invention, a method for assembling a light emitting assembly comprises: (a) preparing a lead-mounting seat including a conductive seat body with first and second insert legs, each of the first and second insert legs having a connecting end and a free end and being reduced in width from the connecting end to the free end; (b) forming first and second insert holes in a circuit board, and inserting respectively the first and second insert legs of the conductive seat body into the first and second insert holes, the first and second insert holes being aligned in a hole-aligning direction, the first insert hole being defined by a hole-defining wall with two opposite ends opposite to each other in the hole-aligning direction, and having a top end and a predetermined length in the hole-aligning direction that permits extension of a predetermined length of a portion of the first insert leg through the top end of the first insert hole, the portion of the first insert leg abutting against the opposite ends of the hole-defining wall of the first insert hole so as to position the conductive seat body at a desired angle relative to the circuit board; (c) mounting a light emitting member to the conductive seat body; and (d) bonding the first and second insert legs to the circuit board through welding techniques.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENTS

Figure 1:
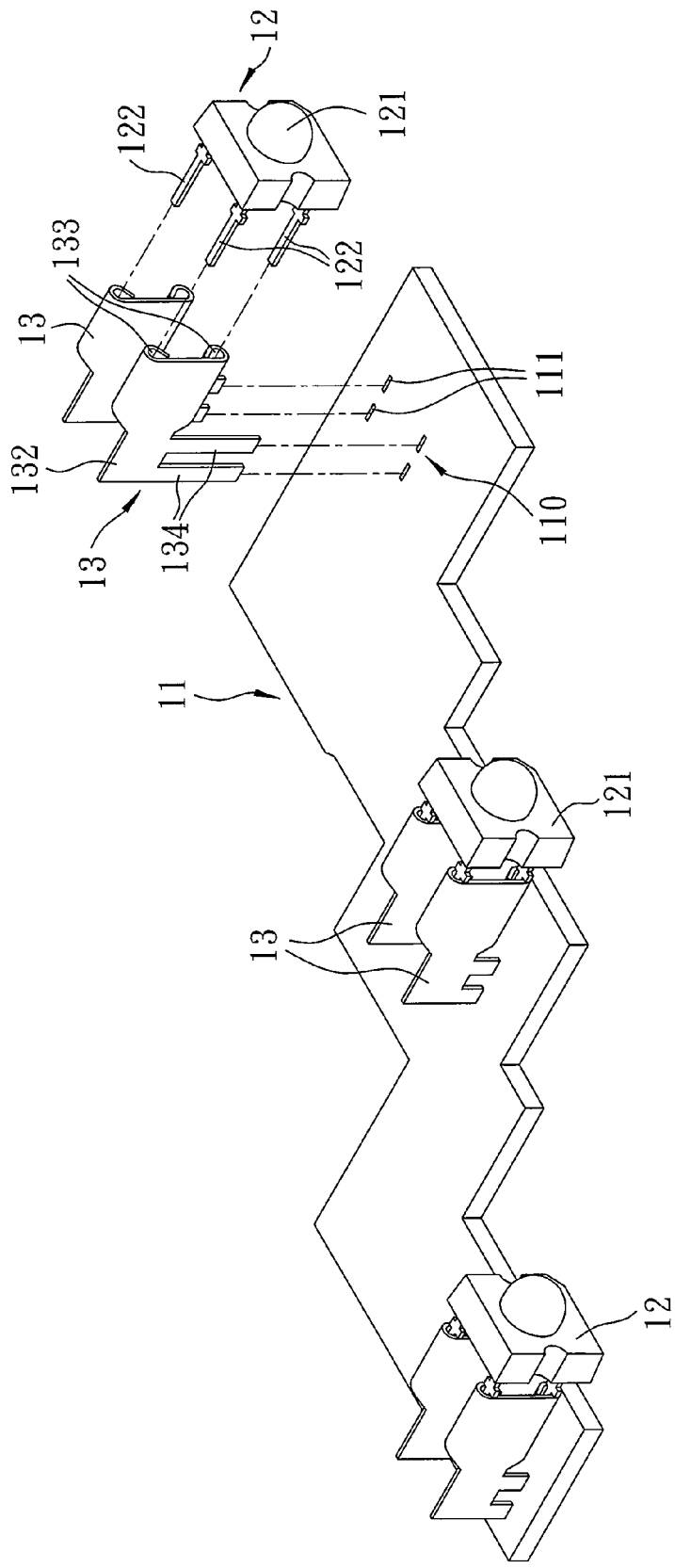
FIG. 1 is an exploded perspective view of a conventional light emitting assembly.
Figure 2:
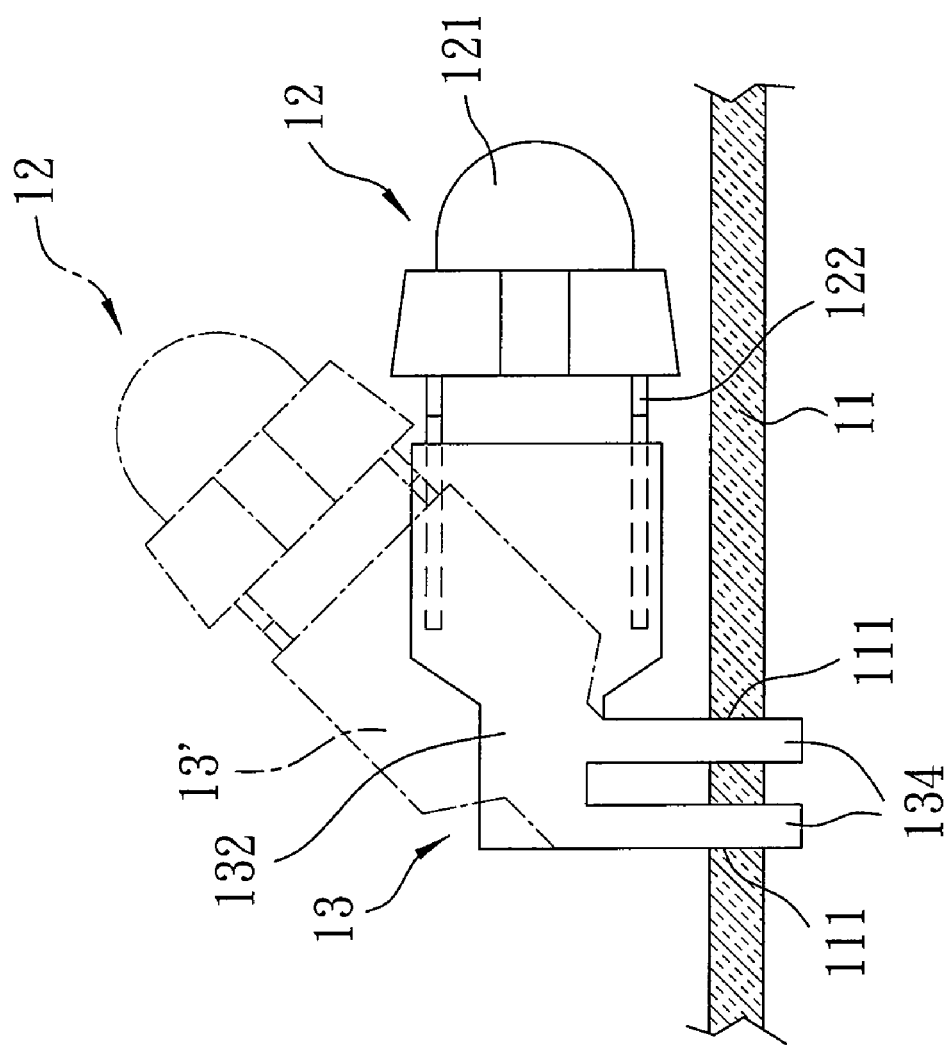
FIG. 2 is a fragmentary assembled sectional view of the conventional light emitting assembly.

Before the present invention is described in greater detail with reference to the accompanying preferred embodiments, it should be noted herein that like elements are denoted by the same reference numerals throughout the disclosure.

Figure 3:
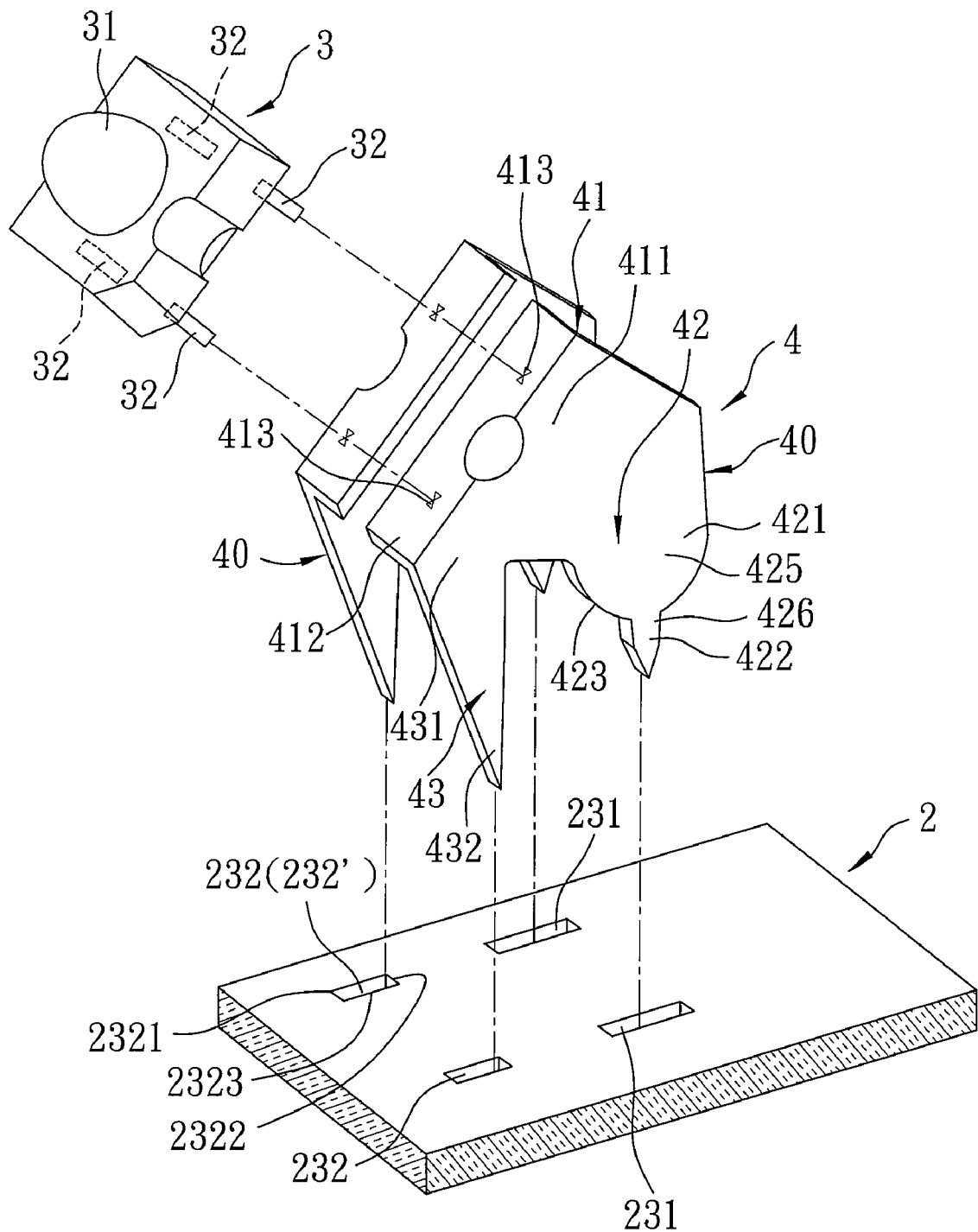
FIG. 3 is a perspective view of the first preferred embodiment of a lead-mounting seat according to the present invention for mounting a light emitting member to a circuit board.
Figure 4:
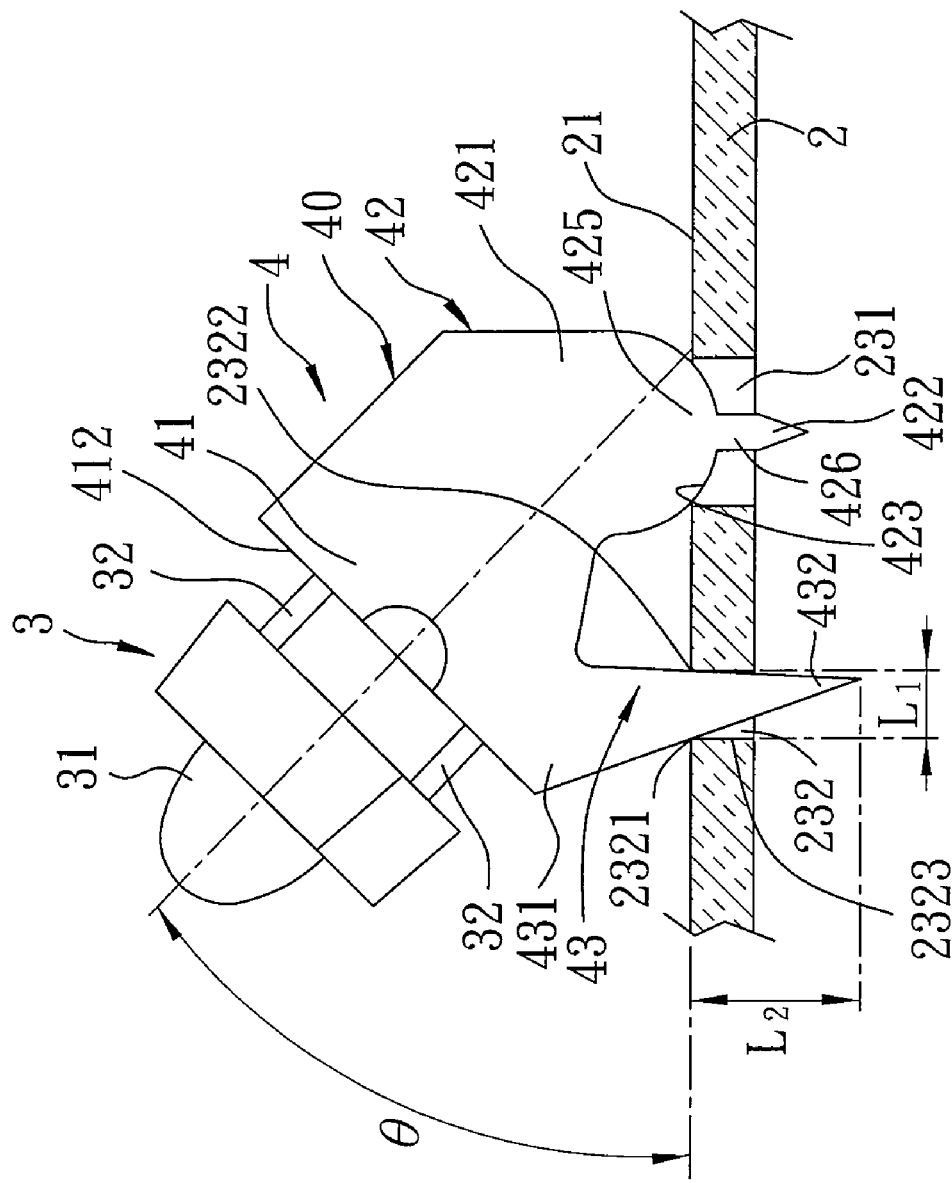
FIGS. 4 to 6 are fragmentary assembled sectional views of the first preferred embodiment, illustrating how the lead-mounting seat can be disposed at different inclined angles relative to a circuit board through changing the length of an insert hole in the circuit board.

FIGS. 3 and 4 illustrate the first preferred embodiment of a lead-mounting seat 4 according to the present invention for mounting a light emitting member 3 to a circuit board 2 so as to form a light emitting assembly.

The circuit board 2 is formed with first and second insert holes 232, 231 that are spaced apart from each other and that are aligned in a hole-aligning direction. The first insert hole 232 is defined by a hole-defining wall 232' with two opposite ends 2321, 2322, and has a top end 2323.

The lead-mounting seat 4 includes a pair of conductive seat bodies 40. For the sake of brevity, only one conductive seat body 40 is described hereinafter. The conductive seat body 40 includes a lead-mounting plate 41 and spaced apart first and second insert legs 43, 42 inserted respectively into the insert holes 232, 231 in the circuit board 2, extending from the lead-mounting plate 41, and having different geometric shapes. The lead-mounting plate 41 is formed with a plurality of lead-mounting holes 413.

Each of the first and second insert legs 43, 42 has a connecting end 431 (421) connected to the lead-mounting plate 41, and a free end 432 (422) opposite to the connecting end 431 (421). Each of the first and second insert legs 43, 42 is reduced in width from the connecting end 431 (421) to the free end 432 (422). The lead-mounting plate 41 has a first segment 411 and a second segment 412 that is bent from and that cooperates with the first segment 411 to form an L-shaped plate. The lead-mounting holes 413 are formed in the second segment 412, and lie on a first plane. The first and second insert legs 43, 42 extend from the first segment 411 along a second plane transverse to the first plane.

The light emitting member 3 has a light emitting part 31 and leads 32 that extend respectively through the lead-mounting holes 413 in the lead-mounting plate 41. In this embodiment, the light emitting member 3 is a light emitting diode.

The second insert leg 42 has a curved end surface 423 that is in contact with a periphery of a top end of the second insert hole 231 in the circuit board 2 at a top surface 21 of the circuit board 2 so as to permit pivoting movement of the conductive seat body 40 relative to the circuit board 2 and to facilitate adjustment of the conductive seat body 40 to a desired angle. In this embodiment, the first insert leg 43 has a triangular shape, and the second insert leg 42 has a generally semi-circular plate portion 425 that defines the curved end surface 423, and a protrusion 426 protruding from the semi-circular plate portion 425.

In this embodiment, the lead-mounting holes 413 are punched in a crisscross shape for clasping the leads 32 of the light emitting member 3. However, in practice, the shape of the lead-mounting holes 413 is not limited to what is disclosed herein.

The preferred embodiment of a method for assembling the light emitting assembly includes the steps of:

(a) preparing the lead-mounting seat 4 by cutting, punching and bending a metal plate;

(b) forming the first and second insert holes 232, 231 in the circuit board 2, and inserting respectively the first and second insert legs 43, 42 of the conductive seat body 40 into the first and second insert holes 232, 231, the first insert hole 232 having a predetermined length ($L_1$) in the hole-aligning direction that permits extension of a predetermined length ($L_2$) of a portion of the first insert leg 43 through the top end 2323 of the first insert hole 232, the portion of the first insert leg 43 abutting against the opposite ends 2321, 2322 of the hole-defining wall 232' of the first insert hole 232 so as to position the conductive seat body 40 at a desired angle (θ) relative to the circuit board 2 (i.e., an angle between the top surface 21 of the circuit board 2 and a normal direction defined by the first plane);

(c) mounting the light emitting member 3 to the second segment 412 of lead-mounting plate 41 of the conductive seat body 40; and (d) bonding the first and second insert legs 43, 42 to the circuit board 2 through welding techniques.

Note that prior to the bonding operation in step (d), the conductive seat body 40 is rotated relative to the circuit board 2 to the desired angle (θ). The pivoting arrangement between the semi-circular plate portion 425 of the second insert leg 42 and the second insert hole 231 facilitates adjustment of the conductive seat body 4 to the desired angle (θ) prior to the bonding operation in step (d).

Preferably, to avoid damage to the light emitting member 3 due to high temperatures, the lead-mounting seat 4 is welded to the circuit board 2 before the leads 32 of the light emitting member 3 are inserted into the lead-mounting holes 413 in the lead-mounting seat 4.

In this embodiment, the angle (θ) of the conductive seat body 40 of the lead-mounting seat 4 relative to the circuit board 2 is about 45 degrees, as best illustrated in FIG. 4. Note that the angle (θ) of the conductive seat body 40 represents a light emitting angle of the light emitting member 3.

Figure 5:
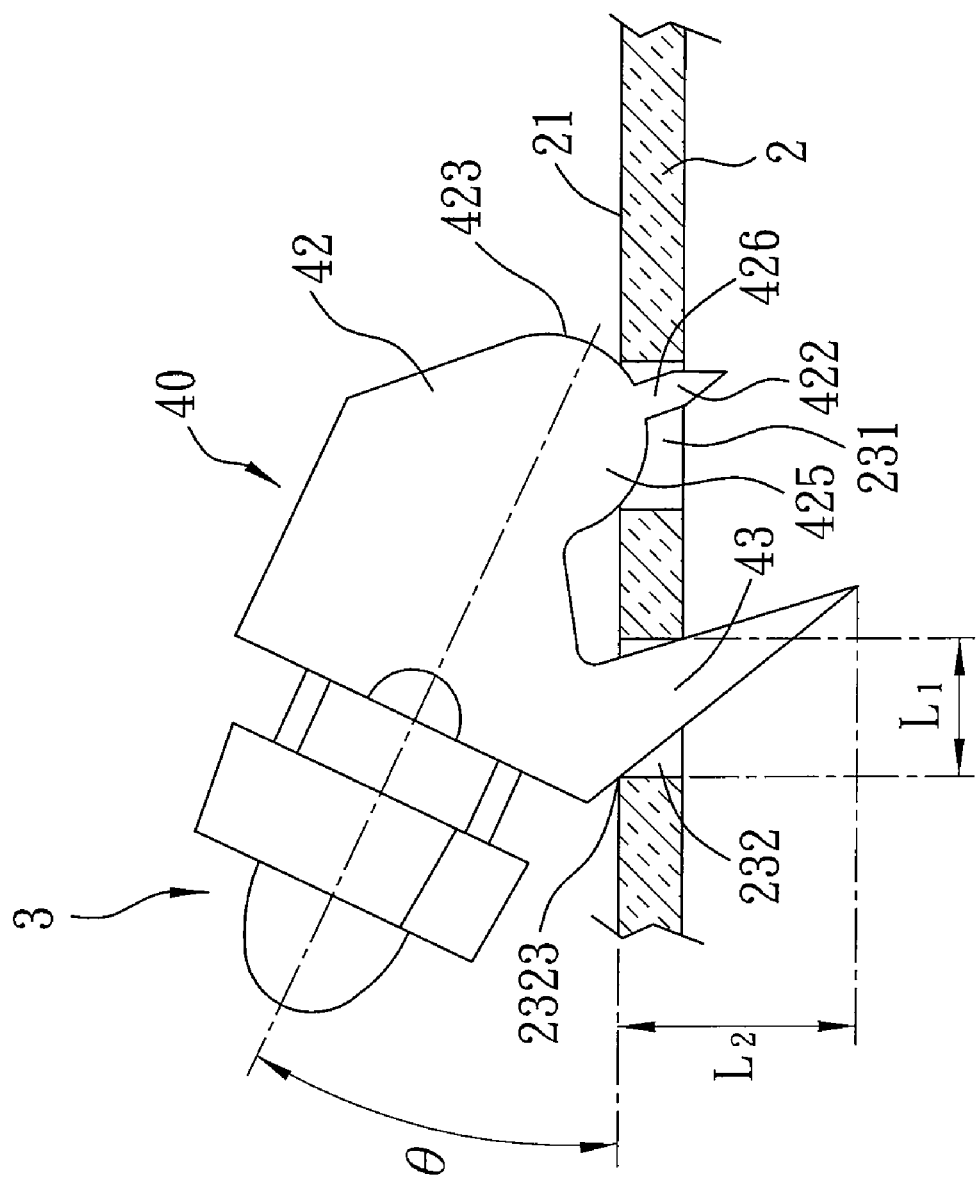
Figure 6:
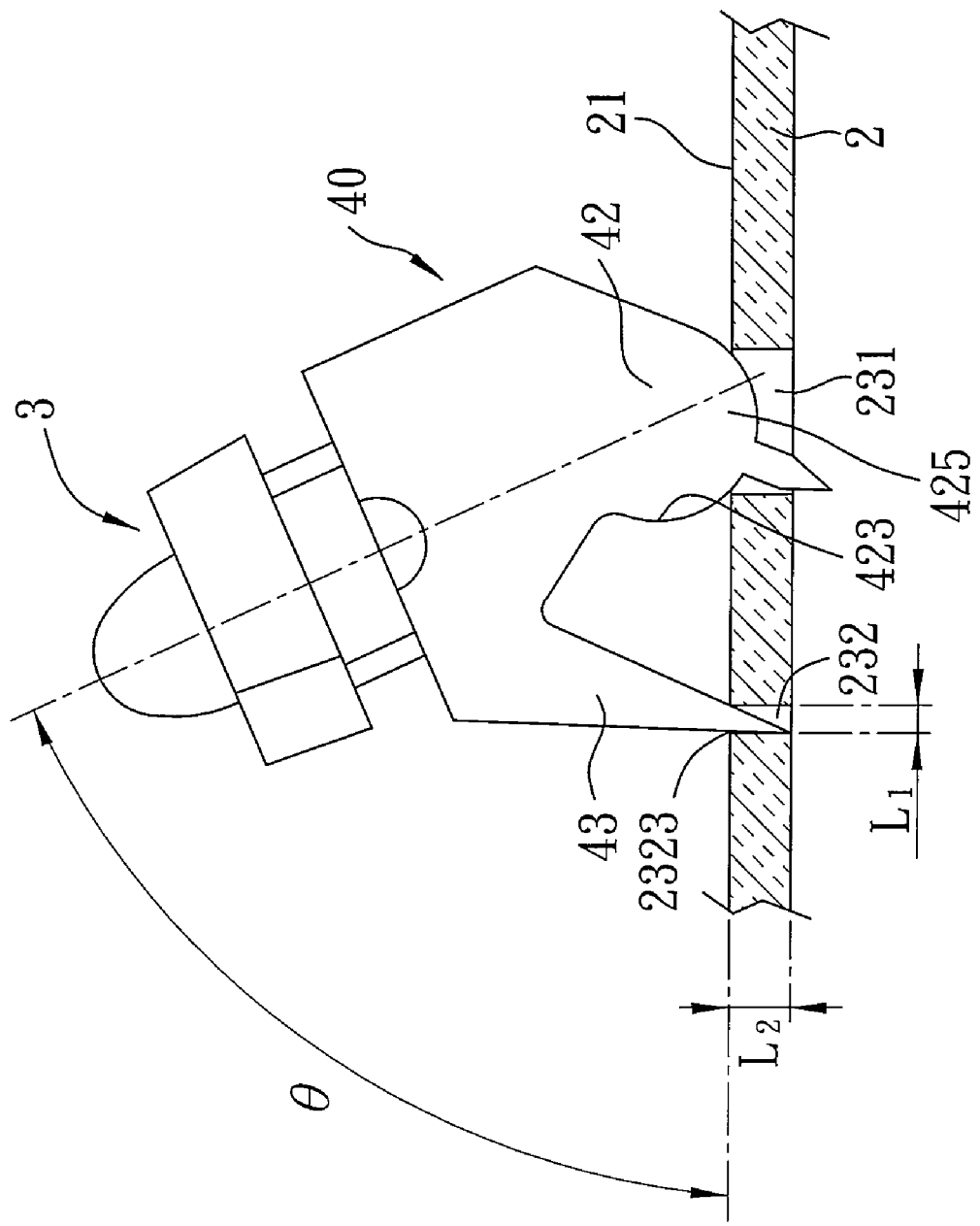

When it is desired to have the light emitting angle be less than 45 degrees, the length ($L_1$) of the first insert hole 232 is increased so as to permit a longer length ($L_2$) of the portion of the first insert leg 43 to extend through the top end 2323 of the first insert hole 232, as best illustrated in FIG. 5. On the other hand, when it is desired to have the light emitting angle be greater than 45 degrees, the length ($L_1$) of the first insert hole 232 is decreased so as to permit a shorter length ($L_2$) of the portion of the first insert leg 43 to extend through the top end 2323 of the first insert hole 232, as best illustrated in FIG. 6.

Figure 7:
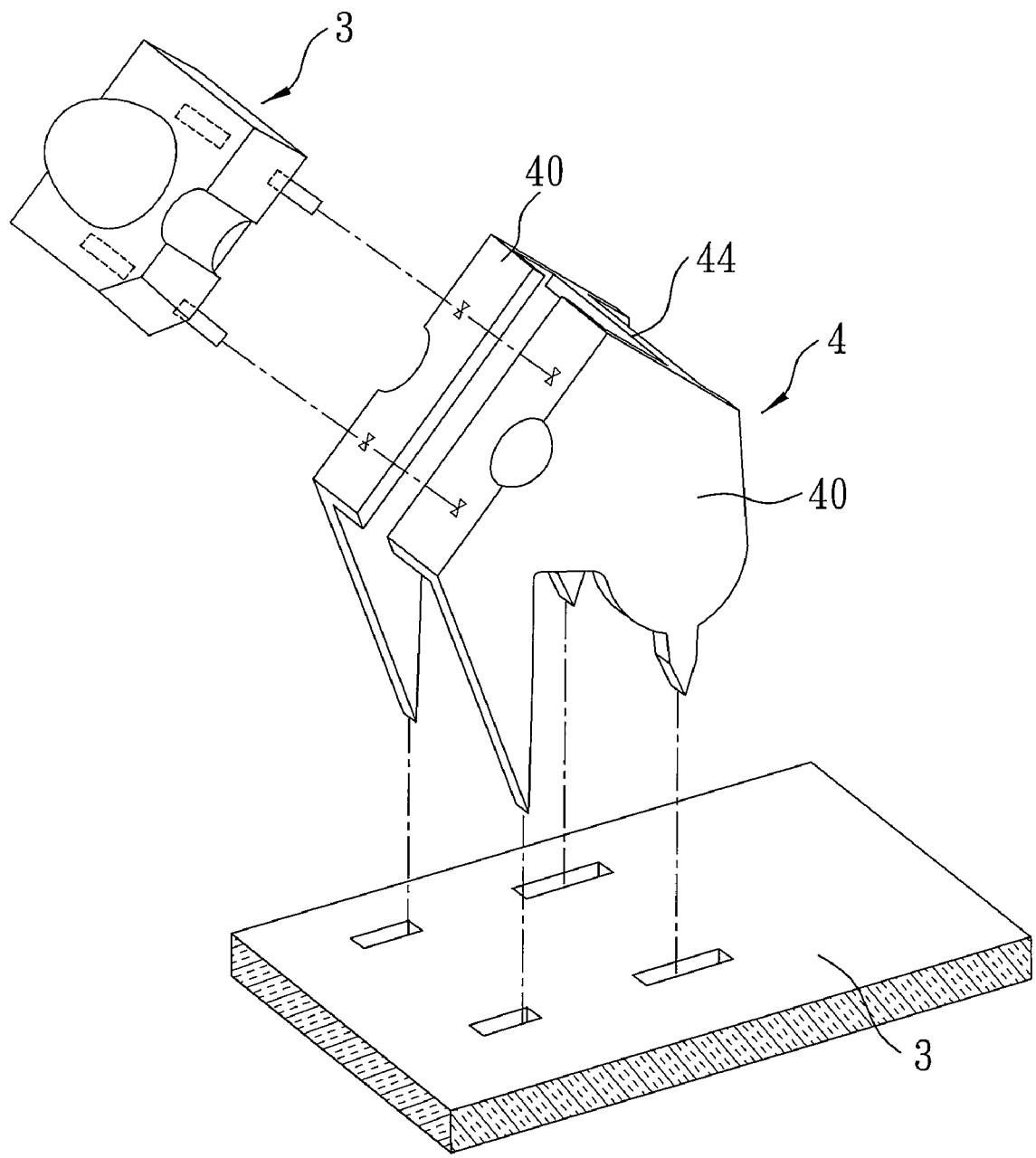
FIG. 7 is a perspective view of the second preferred embodiment of the lead-mounting seat according to the present invention for mounting the light emitting member to the circuit board.
Figure 8:
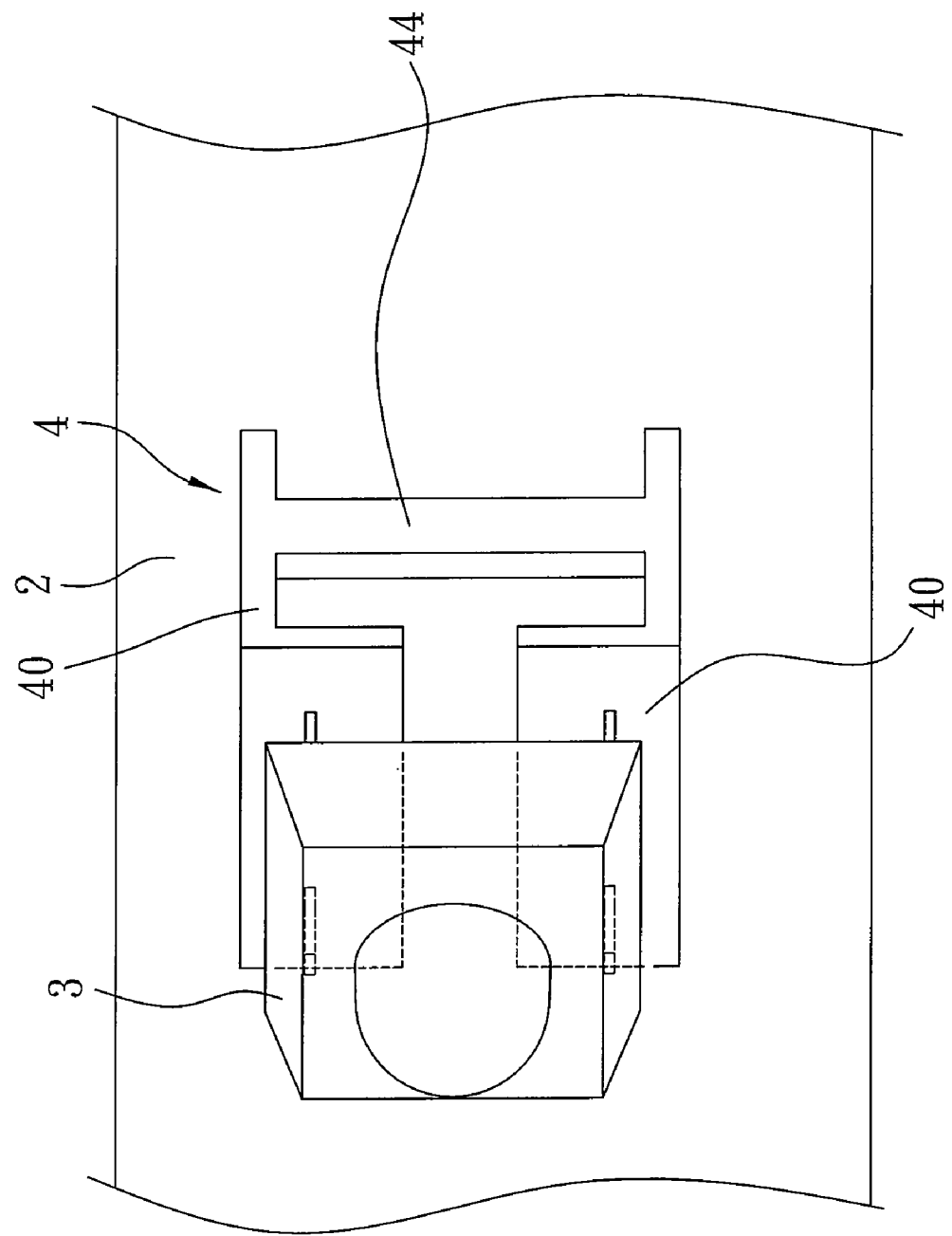
FIG. 8 is a fragmentary assembled top view of the second preferred embodiment.

Referring to FIGS. 7 and 8, the second preferred embodiment of the lead-mounting seat 4 according to the present invention differs from the previous preferred embodiment in that the lead-mounting seat 4 further includes a connecting plate 44 interconnecting the conductive seat bodies 40 for facilitating assembly of the light emitting assembly.

By designing the first and second insert legs 43, 42 of the lead-mounting seat 4 of this invention to have different geometric shapes and gradually reduced widths, the aforesaid drawback associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:
1. A lead-mounting seat comprising:
a conductive seat body including a lead-mounting plate and spaced apart first and second insert legs that extend from said lead-mounting plate and that have different geometric shapes, said lead-mounting plate being formed with a plurality of lead-mounting holes, each of said first and second insert legs having a connecting end connected to said lead-mounting plate, and a free end opposite to said connecting end, each of said first and second insert legs being reduced in width from said connecting end to said free end,
wherein said first insert leg has a triangular shape, and said second insert leg has a generally semi-circular plate portion.

2. The lead-mounting seat of claim 1, wherein said lead-mounting holes lie on a first plane, said first and second insert legs extending along a second plane transverse to the first plane.

3. The lead-mounting seat of claim 1, wherein said second insert leg further has a protrusion protruding from said semi-circular plate portion.

4. A light emitting assembly comprising:
a circuit board formed with first and second insert holes that are spaced apart from each other;
a lead-mounting seat having a conductive seat body including a lead-mounting plate and spaced apart first and second insert legs inserted into said first and second insert holes in said circuit board, extending from said lead-mounting plate, and having different geometric shapes, said lead-mounting plate being formed with a plurality of lead-mounting holes, each of said first and second insert legs having a connecting end connected to said lead-mounting plate, and a free end opposite to said connecting end, each of said first and second insert legs being reduced in width from said connecting end to said free end; and
a light emitting member having leads extending through said lead-mounting holes in said lead-mounting plate.

5. The light emitting assembly of claim 4, wherein said lead-mounting holes lie on a first plane, said first and second insert legs extending along a second plane transverse to the first plane.

6. The light emitting assembly of claim 4, wherein said second insert leg has a curved end surface that is in contact with a periphery of said second insert hole in said circuit board.

7. The light emitting assembly of claim 4, wherein said first insert leg has a triangular shape, and said second insert leg has a generally semi-circular plate portion.

8. The light emitting assembly of claim 4, wherein said light emitting member is a light emitting diode.

9. A method for assembling a light emitting assembly, comprising:
(a) preparing a lead-mounting seat including a conductive seat body with first and second insert legs, each of the first and second insert legs having a connecting end and a free end, and being reduced in width from the connecting end to the free end;
(b) forming first and second insert holes in a circuit board and inserting respectively the first and second insert legs of the conductive seat body into the first and second insert holes, the first and second insert holes being aligned in a hole-aligning direction, the first insert hole being defined by a hole-defining wall with two opposite ends opposite to each other in the hole-aligning direction, and having a top end and a predetermined length in the hole-aligning direction that permits extension of a predetermined length of a portion of the first insert leg through the top end of the first insert hole, the portion of the first insert leg abutting against the opposite ends of the hole-defining wall of the first insert hole so as to position the conductive seat body at a desired angle relative to the circuit board;
(c) mounting a light emitting member to the conductive seat body; and
(d) bonding the first and second insert legs to the circuit board through welding techniques.

10. The method of claim 9, wherein the second insert leg has a curved end surface in contact with a periphery of a top end of the second insert hole so as to permit pivoting movement of the conductive seat body relative to the circuit board and to facilitate adjustment of the conductive seat body to the desired angle prior to the bonding operation in step (d).

11. The method of claim 9, wherein the first insert leg has a triangular shape, and the second insert leg has a generally semi-circular plate portion.

* * * * *